(12) United States Patent
Smith et al.

(10) Patent No.: US 8,647,580 B2
(45) Date of Patent: Feb. 11, 2014

(54) GAS ABATEMENT

(75) Inventors: James Robert Smith, Taunton (GB);
Andrew James Seeley, Bristol (GB)

(73) Assignee: Edwards Limited, Crawley, West Sussex (GB)

( * ) Notice: Subject to any disclaimer, the term of this patent is extended or adjusted under 35 U.S.C. 154(b) by 932 days.

(21) Appl. No.: 11/658,240

(22) PCT Filed: Jul. 19, 2005

(86) PCT No.: PCT/GB2005/002842
§ 371 (c)(1),
(2), (4) Date: Sep. 29, 2008

(87) PCT Pub. No.: WO2006/008521
PCT Pub. Date: Jan. 26, 2006

(65) Prior Publication Data
US 2010/0061908 A1      Mar. 11, 2010

(30) Foreign Application Priority Data
Jul. 22, 2004   (GB) .................................. 0416385.3

(51) Int. Cl.
*B01D 53/70* (2006.01)

(52) U.S. Cl.
USPC .......................................................... 422/168

(58) Field of Classification Search
USPC .............................. 422/168, 173, 174; 417/68
See application file for complete search history.

(56) References Cited

U.S. PATENT DOCUMENTS

| | | | | |
|---|---|---|---|---|
| 2,971,691 A | * | 2/1961 | Lorenz | 417/69 |
| 3,578,943 A | * | 5/1971 | Schoumaker | 219/121.5 |
| 3,642,384 A | * | 2/1972 | Huse | 417/205 |

(Continued)

FOREIGN PATENT DOCUMENTS

| | | |
|---|---|---|
| CH | 673592 A5 | 3/1990 |
| EP | 1205707 A2 | 5/2002 |

(Continued)

OTHER PUBLICATIONS

Matsuura Katsuyoshi, Sakamoto Naoki, Tsurumi Toru, Yamanishi Hirokazu, Kamata Hiroyuki, Sato Yoshiyasu, Abe Kazuhide, Omatsu Hiroshi, Yamamoto Hideo, Nishimura Nobuhiro; abstract of JP 9157852 A, "Vacuum Vapor-Phase Reactor and Treatment of Its Waste Gas," Jun. 17, 1997; Fujitsu Ltd, Shinko Seiki.

(Continued)

*Primary Examiner* — Jill Warden
*Assistant Examiner* — Joye L Woodard
(74) *Attorney, Agent, or Firm* — Westman, Champlin & Koehler, P.A.

(57) ABSTRACT

System for treating an effluent fluid stream from a process tool including a vacuum pump (16) for drawing an effluent stream from the process tool chamber, an abatement device (12) for treating the effluent stream and a liquid ring pump (14) for at least partially evacuating the abatement device (12). During use, the abatement device (12) converts one or more components of the effluent stream, for example F2 or a PFC, into one or more liquid-soluble a compounds, for example HF, that are less harmful to the environment. The liquid ring pump (14) receives the effluent stream and a liquid, and exhausts a solution of the liquid and the liquid-soluble component of the effluent stream. The liquid ring pump (14) thus operates as both a wet scrubber and an atmospheric vacuum pumping stage.

15 Claims, 7 Drawing Sheets

(56) References Cited

U.S. PATENT DOCUMENTS

| | | | |
|---|---|---|---|
| 5,040,949 A * | 8/1991 | Crinquette et al. | 417/205 |
| 5,354,962 A * | 10/1994 | Mizuno et al. | 219/121.52 |
| 5,453,125 A * | 9/1995 | Krogh | 118/723 MR |
| 5,779,998 A | 7/1998 | Tom | |
| 5,869,147 A | 2/1999 | Konig | |
| 6,617,538 B1 * | 9/2003 | Mahawili | 219/121.36 |
| 6,962,679 B2 * | 11/2005 | Josephson et al. | 423/241 |
| 7,060,235 B2 | 6/2006 | Lei | |
| 7,166,198 B2 * | 1/2007 | Van Der Walt et al. | 219/121.59 |
| 2002/0066535 A1 * | 6/2002 | Brown et al. | 156/345.29 |
| 2003/0201168 A1 | 10/2003 | Chae et al. | |
| 2004/0131524 A1 | 7/2004 | Josephson et al. | |

FOREIGN PATENT DOCUMENTS

| | | | |
|---|---|---|---|
| GB | 949 370 | | 2/1964 |
| GB | 1 408 124 | | 10/1975 |
| GB | 2 273 027 | * | 6/1994 |
| JP | 9-157852 | | 6/1997 |
| TW | 442322 B | | 6/2001 |
| TW | 200412254 | | 7/2004 |

OTHER PUBLICATIONS

United Kingdom Search Report of Application No. GB 0416385.3 dated Dec. 15, 2004; Claims searched: 1-22; Date of Search: Dec. 14, 2004.

PCT Notification of Transmittal of the International Search Report and the Written Opinion of the International Searching Authority, or the Declaration of International Application No. PCT/GB2005/002842; Date of mailing: Oct. 18, 2005.

PCT International Search Report of International Application No. PCT/GB2005/002842; Date of mailing of the International Search Report: Oct. 18, 2005.

PCT Written Opinion of the International Searching Authority of International Application No. PCT/GB2005/002842; Date of mailing: Oct. 18, 2005.

Prosecution documents for corresponding Chinese Application No. 200580024673.X including: First Office Action dated Nov. 23, 2007; Response dated May 20, 2008.

Prosecution documents for corresponding European Application No. 05761329.1 including: Communication dated Oct. 5, 2010; Communication dated Jul. 3, 2013; Response dated May 15, 2011; Response dated May 16, 2013; Communication dated Feb. 6, 2013.

Prosecution documents for corresponding Korean Application No. 2007-7001424 including: Notice of Preliminary Rejection dated Oct. 2011; Response dated Feb. 23, 2012.

Prosecution documents for corresponding Taiwanese Application No. 094124801 including: Office Action dated Mar. 30, 2012; Search Report dated Mar. 29, 2012; Response dated Sep. 25, 2012; Replacement Claims dated Oct. 2012.

* cited by examiner

GAS ABATEMENT

FIELD OF THE INVENTION

The present invention relates to gas abatement. The invention finds particular use in the abatement of gases exhaust from a process tool, for example a process tool used in the semiconductor or flat panel display manufacturing industry.

BACKGROUND OF THE INVENTION $CF_4$, $C_2F_6$, $NF_3$ and $SF_6$ are commonly used in the semiconductor and flat panel display manufacturing industries, for example, in dielectric layer etching and chamber cleaning. Following the manufacturing or cleaning process there is typically a residual PFC content in the effluent gas stream pumped from the process tool. PFCs are difficult to remove from the effluent stream, and their release into the environment is undesirable because they are known to have relatively high greenhouse activity.

Figure 1:
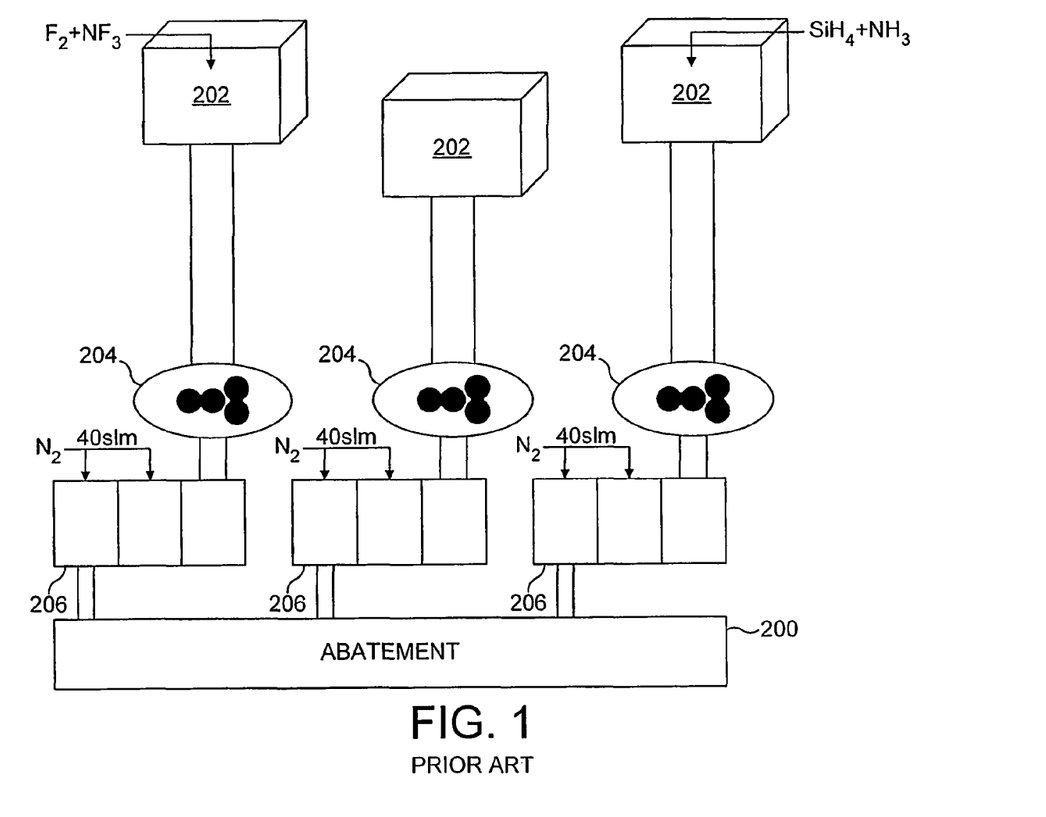
FIG. 1 illustrates a system for evacuating a plurality of process chambers.

As illustrated in FIG. 1, it is known to provide an abatement device for treating such gases exhaust from process tools. In the illustrated example, the abatement device 200 is located downstream from one or more evacuation systems each for evacuating a respective process chamber 202 of a process tool. In this example, each evacuation system comprises a Roots blower 204 or other secondary pump for drawing the effluent stream from the process chamber 202, the Roots blower 204 being backed by a multi-stage dry pump 206 that exhausts the effluent stream at or around atmospheric pressure to the abatement device 200. A suitable backing pump 206 comprises a combination of Roots and Northey ("claw") type pumping mechanisms.

The object of the abatement is to convert relatively harmful components of the effluent stream into compounds that are less harmful to the environment and/or into compounds that can be more conveniently disposed of, for example, by a wet scrubber (not shown) located downstream from the abatement device 200. Conventional abatement devices include incineration, plasma abatement and thermal decomposition tools.

Semiconductor manufacturing processes typically produce as by-products particulates or powders that are drawn from the process chamber 202 by the to evacuation system. As the pumping mechanisms of the backing pump 206 require close tolerances to be maintained between the rotor and stator components of the pumping stages during use, it is normal practice to inject an inert purge gas, such as nitrogen, into the pumping mechanisms. This purge gas serves to reduce the level of by-product contamination of the backing pump 206. However, in view of the relatively high flow rates of purge gas into each backing pump 206 (typically around 40 to 50 slm) in comparison to the flow rate of the effluent stream exhaust from each process tool 202 (typically around 5 slm), the injection of purge gas into one or more of the backing pumps 206 significantly increases the power requirement of the abatement device 200, as abatement of an effluent stream containing 70 to 90% purge gas requires significantly more power than the abatement of an effluent stream containing no purge gas.

It is an aim of at least the preferred embodiment of the present invention to seek to provide a relatively simple, efficient and low cost technique for treating an effluent gas stream from a process tool.

SUMMARY OF THE INVENTION

In a first aspect, the present invention provides apparatus for treating an effluent gas stream from a process tool, the apparatus comprising an abatement device for converting a component of the effluent stream into a liquid-soluble component at a sub-atmospheric pressure, a pump for at least partially evacuating the abatement device, and means for conveying a liquid to the pump, the pump comprising a pumping mechanism, means for receiving the effluent stream from the abatement device and the liquid from the liquid conveying means, and an outlet for exhausting a solution comprising the liquid and the liquid-soluble component of the gas stream.

In another embodiment, the pump comprises a screw pumping mechanism, preferably a multi-rotor screw mechanism. Multi-rotor screw-mechanism pumps are capable of pumping mixtures of gas and liquid, and can thus be used as an alternative to a liquid ring pump for the present invention. Multi-rotor screw pumping mechanisms comprise of two or more rotating screws within a stationary stator, in which fluid is transported axially in the cavities formed by the meshing teeth of the screw rotors. The direction of fluid movement through the mechanism is dependent upon the direction of rotation of the screw rotors. Compression is provided, not within the pump itself but by the restriction to the outlet, which is often simply atmospheric pressure.

In the preferred embodiment, the pump is located downstream of the abatement device such that, during use, the effluent stream passes through the abatement device at a sub-atmospheric pressure. With this configuration, the abatement device can convert a component of the effluent stream into a compound that is less reactive than said component with the liquid of the pump. For example, whilst F2 is soluble within water, it may react with water to form insoluble compounds, such as $OF_2$. Conversion of $F_2$ into HF can inhibit the formation of such compounds. Thus, with this configuration the abatement device can convert one or more components of the effluent stream into components that are soluble within the liquid of the pump.

In an alternative abatement technique, the effluent waste stream is brought into contact with a stream containing a reactant for reacting with the components within the waste stream. For example, where these components are PFCs, a superheated stream of water vapour may be used to convert the PFCs into components, such as HF, which can be taken into solution in the pump. By providing a method in which reactive species are formed from a reactive fluid for subsequent reaction with such components of the effluent stream, it has been found that the energy required to cause the destruction of the component in the effluent stream, and the efficiency of that destruction, can be radically improved. For example, $H^+$ and $OH^-$ ions formed from the dissociation of water are capable of reacting with, for example, a PFC contained in the effluent stream at ambient temperature, and thus at a much lower temperature than would be required if the water had not been pre-ionised before being introduced into the effluent stream. Further advantages are that a relatively cheap and readily available fluid, such as water vapour or a fuel, for example methane or an alcohol, can be used to generate $H^+$ and/or $OH^-$ ions, as the reactive species, and that the reaction can take place at sub-atmospheric or atmospheric pressure.

In the preferred embodiment, a single plasma gun is used to inject the plasma stream into the reaction chamber. However, a plurality of such guns may be provided to inject a plurality of plasma streams into the same chamber, each for abating a common or respective gas stream. Alternatively, a plurality of gas streams may be conveyed to a single chamber, into which a single plasma stream is injected. This can increase further the efficiency of the treatment of the waste stream. These guns may be connected to a common power source or to respective sources.

In a further aspect, the present invention provides a system for evacuating a process tool, the system comprising a vacuum pump for drawing an effluent fluid stream from the tool and apparatus as aforementioned for receiving and treating the effluent stream exhaust from the vacuum pump. Such a pump may comprise any convenient pump for exhausting the effluent stream at a pressure in the range from 10 to 200 mbar. For example, the vacuum pump may comprise a turbomolecular pump, a molecular drag pump, or a multi-stage dry pump. Such a pump preferably comprises a plurality of Roots-type pumping stages, as such pumping mechanisms have larger tolerances than Northey-type mechanisms and so are less prone to seizure due to the accumulation of solid by-products within the running clearances of the pumping mechanism.

In a yet further aspect, the present invention provides a method of treating an effluent gas stream from a process tool, the method comprising the steps of conveying the effluent stream to an abatement device for converting a component of the effluent stream into a liquid-soluble component at a sub-atmospheric pressure, conveying the effluent stream from the abatement device to a pump for at least partially evacuating the abatement device, simultaneously conveying to the pump a liquid, and exhausting from the pump the liquid containing the liquid-soluble component of the gas stream.

BRIEF DESCRIPTION OF THE DRAWINGS

Preferred features of the present invention will now be described with reference to the accompanying drawings, in which.

DETAILED DESCRIPTION OF THE INVENTION

In a first aspect, the present invention provides apparatus for treating an effluent gas stream from a process tool, the apparatus comprising an abatement device for converting a component of the effluent stream into a liquid-soluble component at a sub-atmospheric pressure, a pump for at least partially evacuating the abatement device, and means for conveying a liquid to the pump, the pump comprising a pumping mechanism, means for receiving the effluent stream from the abatement device and the liquid from the liquid conveying means, and an outlet for exhausting a solution comprising the liquid and the liquid-soluble component of the gas stream.

In one embodiment, the pump comprises a liquid ring pump. A liquid ring pump comprises a rotor rotatably mounted in an annular housing such that the rotor axis is eccentric to the central axis of the housing. The rotor has blades that extend radially outwardly therefrom and are equally spaced around the rotor. A quantity of a pumping liquid such as water is maintained in the housing. As used herein, the term "liquid-insoluble component" means a component of the effluent stream which is not soluble within the liquid of the pump, this liquid typically being water, and the term "liquid-soluble component" means a component of the effluent stream which is soluble within that liquid. Examples of such liquid-insoluble components are perfluorinated or hydrofluorocarbon compounds, such as $CF_4$, $C_2F_6$, $CHF_3$, $C_3F_8$, and $C_4F_8$, which can be converted into $CO_2$ and HF, which can be taken into solution in the pump. Other examples are $NF_3$, which can be converted into $N_2$ and HF, and $SF_6$, which can be converted into $SO_2$ and HF.

As the rotor rotates, the rotor blades engage the liquid and form it into an annular ring inside the housing. This means that on an inlet side of the pump the gas present in the compression regions located between adjacent rotor blades is moving radially outward, away from the rotor hub, while on the outlet side of the pump the gas is moving radially inward toward the rotor hub. This results in a piston-type pumping action on the gas passing through the pump.

In this preferred embodiment, a gas inlet is provided at the inlet side of the pump so that the effluent stream containing the liquid soluble species is pulled into the spaces between adjacent rotor blades where the liquid is moving radially outward. A further inlet for simultaneously conveying to the housing liquid for forming the liquid ring within the housing is typically provided at the bottom of the housing, between the inlet and outlet sides of the pump. As the effluent gas stream is caused to come into contact with the pumping liquid, any liquid-soluble components of the effluent stream are washed into the pumping liquid and thus removed from the effluent stream before the gas stream is exhaust, at or around atmospheric pressure, from the pump with a solution of the liquid and the liquid-soluble components of the effluent stream. A pump outlet allows for the discharge of the solution and any gas from the pump.

As mentioned above, the pump may be provided with a separate inlet for receiving the liquid. Alternatively, the liquid may enter the pump through the gas inlet with the effluent stream, with the liquid being conveyed from a source thereof into the effluent stream upstream of the gas inlet.

In another embodiment, the pump comprises a screw pumping mechanism, preferably a multi-rotor screw mechanism. Multi-rotor screw-mechanism pumps are capable of pumping mixtures of gas and liquid, and can thus be used as an alternative to a liquid ring pump for the present invention. Multi-rotor screw pumping mechanisms comprise of two or more rotating screws within a stationary stator, in which fluid is transported axially in the cavities formed by the meshing teeth of the screw rotors. The direction of fluid movement through the mechanism is dependent upon the direction of rotation of the screw rotors. Compression is provided, not within the pump itself but by the restriction to the outlet, which is often simply atmospheric pressure.

In this embodiment a gas inlet is provided at the inlet end of the pump so the effluent gas stream. A second inlet may be provided for the introduction of a liquid stream into the pump at the same time as the effluent gas stream. Alternatively, the liquid may be conveyed into the effluent stream upstream from the gas inlet and that the liquid enters the pump simultaneously with the gas stream. Similar to the liquid ring pump, any liquid-soluble components of the effluent stream are entrained by the liquid stream. A pump outlet allows for the discharge of the liquid stream from the pump.

The liquid ring pump or screw-mechanism pump thus operates as both a wet scrubber and an atmospheric vacuum pumping stage for the effluent gas stream. Where the pump is located downstream from the abatement device, a conventional wet scrubber is no longer required, thereby reducing costs. Furthermore, unlike a Roots or Northey-type pumping mechanism, any particulate or powder by-products exhaust from the tool do not have a detrimental effect on the pumping mechanism of the liquid ring pump, and so there is no longer any requirement to provide any purge gas to the atmospheric pumping stage. Therefore, irrespective of whether the liquid ring pump is located upstream or downstream from the abatement device, the amount of gas entering the abatement device is significantly reduced in comparison to the known example shown in FIG. 1.

The abatement device is preferably configured to convert a component of the effluent stream into a different compound. For example, the abatement device may be configured to convert one or more components of the effluent stream, such as $SiH_4$ and/or $NH_3$ into one or more compounds that are less reactive than said component with another component of the effluent stream such as $F_2$. Such gases may be present where the abatement device is configured to treat the effluent streams exhaust from different process tools, or where different process gases are supplied to a process tool at different times. Pre-treating the $SiH_4$ and $NH_3$ gases can inhibit the formation of reactive gas mixtures within the effluent stream. For example, the pre-treatment of $SiH_4$ can form $SiO_2$.

In the preferred embodiment, the pump is located downstream of the abatement device such that, during use, the effluent stream passes through the abatement device at a sub-atmospheric pressure. With this configuration, the abatement device can convert a component of the effluent stream into a compound that is less reactive than said component with the liquid of the pump. For example whilst $F_2$ is soluble within water, it may react with water to form insoluble compounds, such as $OF_2$. Conversion of $F_2$ into HF can inhibit the formation of such compounds. Thus, with this configuration the abatement device can convert one or more components of the effluent stream into components that are soluble within the liquid of the pump.

As mentioned above, the component of the effluent stream may be initially liquid-soluble, or it may be liquid-insoluble. Examples of liquid-insoluble compounds are $CF_4$, $C_2F_6$, $CHF_3$, $C_3F_8$, $C_4F_8$, $NF_3$ and $SF_6$.

Any one of a range of equipment may be used to decompose the components of the effluent stream. For example, a burner or such like may be provided to thermally decompose these components. One suitable example is described in our European patent application no. 1,205,707, the contents of which are incorporated herein by reference. Alternatively, a plasma generator may be used to decompose these components. In one known plasma abatement technique, the effluent gas stream is conveyed into a resonant cavity using microwave radiation to generate, from components such as PFCs, a microwave plasma. Another known technique is to convey the effluent stream into a dielectric tube, a high frequency surface-wave exciter being used to produce surface waves which generate a plasma within the tube to dissociate the PFCs. The plasma may be generated using radiation at a frequency of around 580 kHz, 13.56 MHz, 27 MHz, 915 MHz or 2.45 GHz.

Alternatively, a glow discharge may be generated to decompose these components. As is well known, a glow discharge is a luminous, thermal plasma formed by applying to a gas a voltage that is greater than the breakdown voltage of that gas. The components may be decomposed by a discharge other than a glow discharge, for example by a corona discharge or than an arc discharge. Such a discharge may be generated using a plasma gun, in which an electric arc is created between a water-cooled nozzle (anode) and a centrally located cathode. A stream of fluid passes through the electric arc and is dissociated thereby. The plasma of ionised fluid issuing from the nozzle resembles an open oxy-acetylene flame.

In an alternative abatement technique, the effluent waste stream is brought into contact with a stream containing a reactant for reacting with the components within the waste stream. For example, where these components are PFCs, a superheated stream of water vapour may be used to convert the PFCs into components, such as HF, which can be taken into solution in the pump. By providing a method in which reactive species are formed from a reactive fluid for subsequent reaction with such components of the effluent stream, it has been found that the energy required to cause the destruction of the component in the effluent stream, and the efficiency of that destruction, can be radically improved. For example, $H^+$ and $OH^-$ ions formed from the dissociation of water are capable of reacting with, for example, a PFC contained in the effluent stream at ambient temperature, and thus at a much lower temperature than would be required if the water had not been pre-ionised before being introduced into the effluent stream. Further advantages are that a relatively cheap and readily available fluid, such as water vapour or a fuel, for example methane or an alcohol, can be used to generate $H^+$ and/or $OH^-$ ions, as the reactive species, and that the reaction can take place at sub-atmospheric or atmospheric pressure.

Various techniques may be used to form the ions using a plasma gun. In a first technique, a plasma stream is formed and, prior to the injection of the plasma stream into the chamber, water (as an example of a suitable source of these ions) is conveyed to the stream so that a flame containing these ions is injected into the chamber to abate the effluent gas stream within. The water may be conveyed to the plasma stream separately from the source gas, or within a fluid mixture comprising both water vapour and the source gas. In a second technique, both water and the effluent gas stream are separately conveyed into the chamber. The water is dissociated by the flame to form heated ions within the chamber, which ions subsequently react with a PFC component of the waste stream. In a third technique, the effluent gas stream is conveyed to the plasma stream prior to its injection into the reaction chamber, so that both the plasma stream and the gas stream, which may comprise the PFC and/or radicals generated from the PFC, are injected into the reaction chamber. Water may be conveyed to the plasma stream upstream from the aperture, that is, with one of the source gas or the effluent gas stream, or separately therefrom, or may be conveyed to the plasma stream downstream from the nozzle, for example, directly to the reaction chamber. In this case, the water may impinge upon the plasma stream to form heated ions within the chamber for reacting with the PFC and/or the PFC radicals, and/or may react directly with the PFC radicals within the chamber for abatement thereof.

In the preferred embodiment, a single plasma gun is used to inject the plasma stream into the reaction chamber. However, a plurality of such guns may be provided to inject a plurality of plasma streams into the same chamber, each for abating a common or respective gas stream. Alternatively, a plurality of gas streams may be conveyed to a single chamber, into which a single plasma stream is injected; This can increase further the efficiency of the treatment of the waste stream. These guns may be connected to a common power source or to respective sources.

In a further aspect, the present invention provides a system for evacuating a process tool, the system comprising a vacuum pump for drawing an effluent fluid stream from the tool and apparatus as aforementioned for receiving and treating the effluent stream exhaust from the vacuum pump. Such a pump may comprise any convenient pump for exhausting the effluent stream at a pressure in the range from 10 to 200 mbar. For example, the vacuum pump may comprise a turbomolecular pump, a molecular drag pump, or a multi-stage dry pump. Such a pump preferably comprises a plurality of Roots-type pumping stages, as such pumping mechanisms have larger tolerances than Northey-type mechanisms and so are less prone to seizure due to the accumulation of solid by-products within the running clearances of the pumping mechanism.

In a yet further aspect, the present invention provides a method of treating an effluent gas stream from a process tool, the method comprising the steps of conveying the effluent stream to an abatement device for converting a component of the effluent stream into a liquid-soluble component at a sub-atmospheric pressure, conveying the effluent stream from the abatement device to a pump for at least partially evacuating the abatement device, simultaneously conveying to the pump a liquid, and exhausting from the pump the liquid containing the liquid-soluble component of the gas stream.

Figure 2:
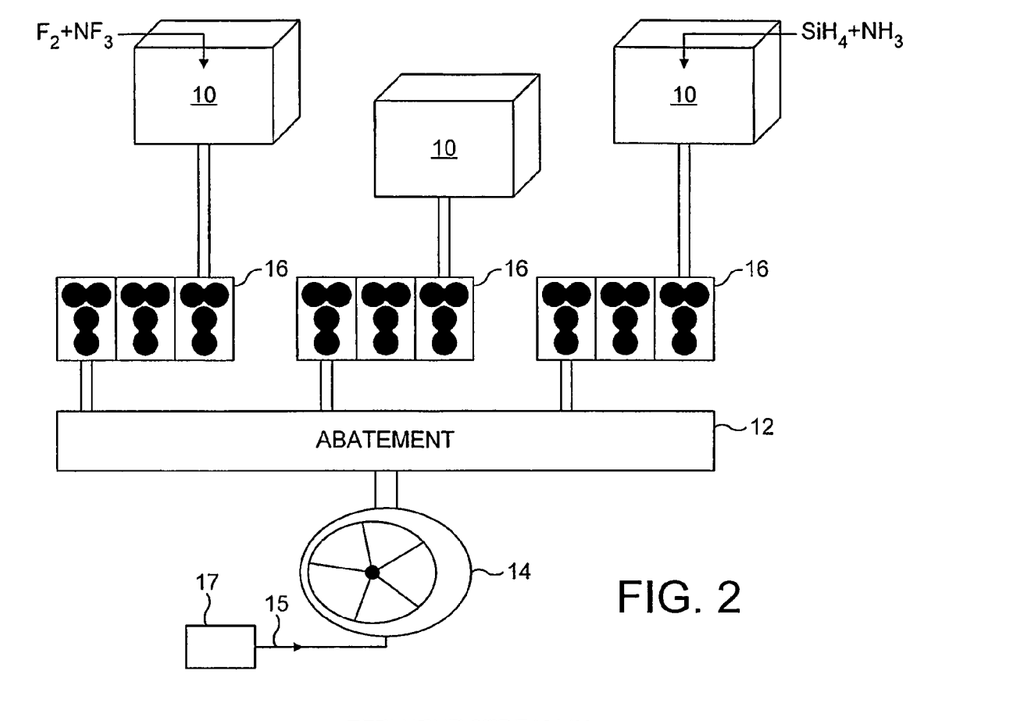
FIG. 2 illustrates a first embodiment of an apparatus for treating an effluent waste stream.

With reference to FIG. 2, a first embodiment of an apparatus for treating an effluent gas stream exhaust from one or more process chambers 10 of respective process tools comprises an abatement device 12 and a liquid ring pump 14. The abatement device 12 is located downstream from one or more high capacity secondary pumps 16 (three shown in FIG. 2, although any suitable number may be provided). In the illustrated embodiment, each secondary pump 16 comprises a multi-stage dry pump, wherein each pumping stage is provided by a Roots-type pumping mechanism. Alternatively, one or more of the secondary pumps 16 may comprise a turbomolecular pump and/or a molecular drag mechanism, depending on the pumping requirements of the respective process chamber(s) 10.

The secondary pumps 16 draw effluent gas streams from the process chambers 10 and exhaust the pumped gas streams at a sub-atmospheric pressure, typically in the range from 50 to 200 mbar, and at a rate of around 5 slm, to the abatement device 12. The abatement device 12 receives the pumped gas streams and converts components of the gas streams, such as $SiH_4$ and $NH_3$, into substances which are less reactive with other components of the received gas streams, such as $F_2$, and converts such components and others such as PFCs and $F_2$ into substances that can be readily removed by the pumping liquid within the liquid ring pump 14.

The abatement device 12 may utilise any technique which is suitable for the abatement of a sub-atmospheric effluent stream, such as incineration, plasma abatement, thermal decomposition, decomposition using gas additions, or gas streams containing ions selected to cause the effluent gas to react and form is the aforementioned substances. Examples of such an abatement device 12 will now be described with reference to FIGS. 3 to 7.

Figure 3:
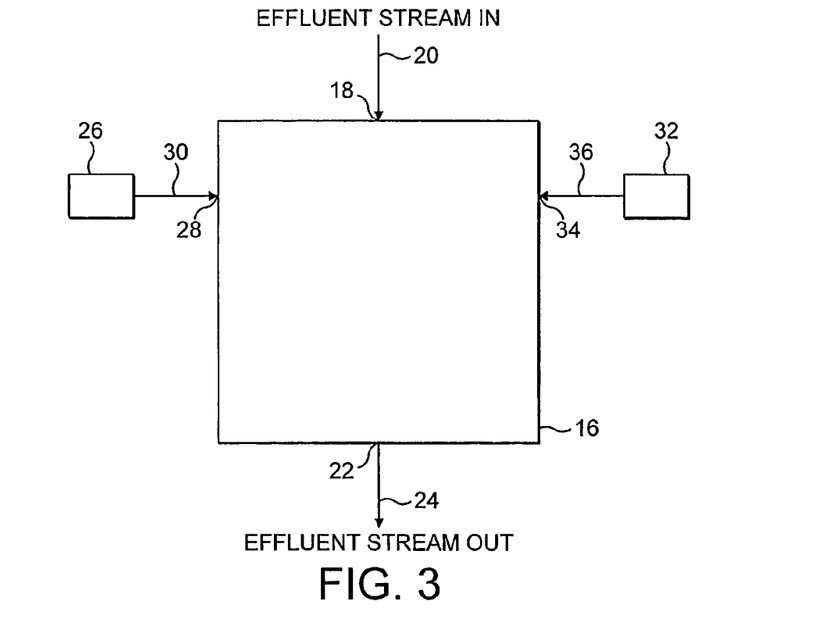
FIG. 3 illustrates the fluid supply to an example of a plasma abatement device of the apparatus of FIG. 2.

FIG. 3 illustrates the gas supplies to the abatement device 12. The effluent stream is conveyed to a first inlet 18 of the abatement device 12 by conduit 20, and is conveyed from the outlet 22 of the abatement device 12 by conduit 24. A source of $OH^-$ and/or $H^+$ ions, in this example water, is supplied from a source 26 thereof to a second inlet 28 of the abatement device 12 by conduit 30, and an ionisable, plasma source gas, in this example nitrogen, is supplied from a source 32 thereof to a third inlet 34 of the abatement device by conduit 36.

Figure 4:
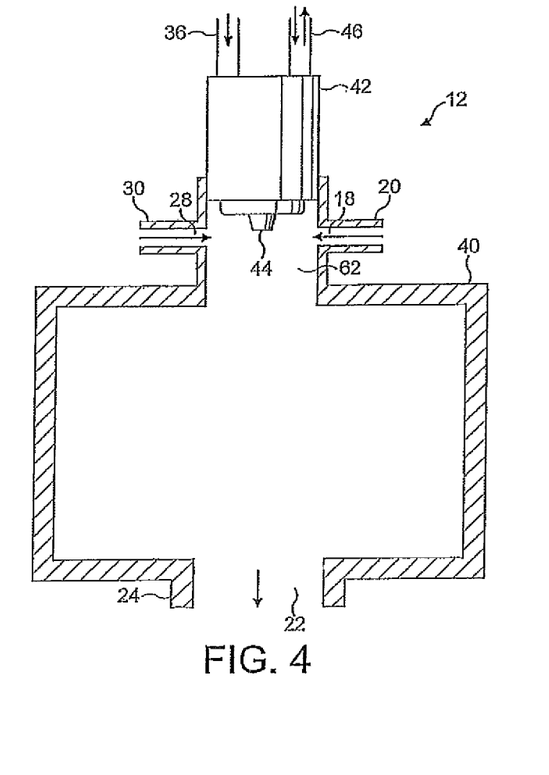
FIG. 4 illustrates in more detail the plasma abatement device of FIG. 3.

With reference to FIG. 4 the abatement device 12 comprises a reaction chamber 40 in which are formed the first inlet 18 for receiving the effluent stream, the second inlet 28 for receiving the ion source, and the outlet 22 for exhausting from the chamber 40 a fluid stream containing by-products from the abatement process and other, unabated gases contained within the effluent stream entering the abatement device 12. The abatement device 12 further comprises a dc plasma torch 42 for receiving the nitrogen stream from the conduit 36 and generating a plasma stream that is injected into the chamber 40 in the form of a flame emitted from an aperture or nozzle 44 of the plasma torch 42. As shown in FIG. 4, the plasma torch 42 also receives a flow of water coolant that enters and leaves the torch via a conduit system indicated generally at 46 in FIG. 4.

Figure 5:
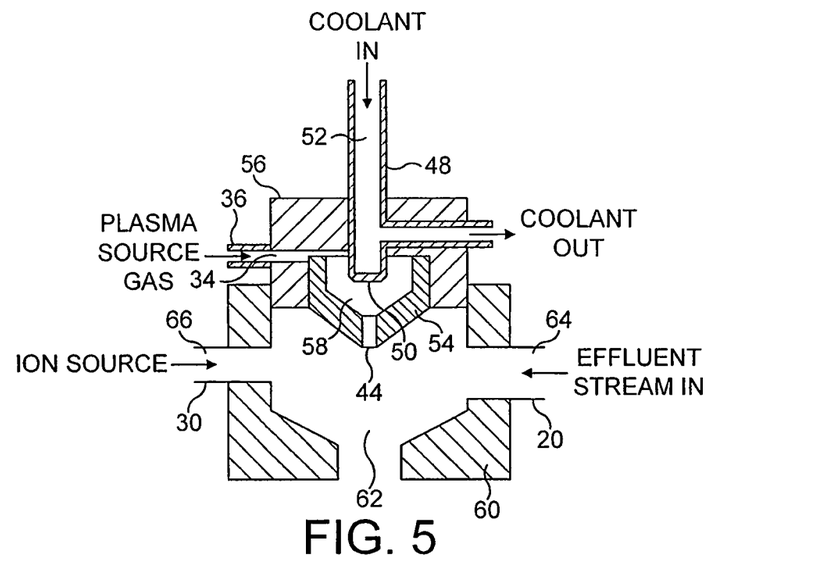
FIG. 5 illustrates one embodiment of a plasma torch suitable for use in the device of FIG. 4.

FIG. 5 shows in more detail the configuration of one embodiment of the plasma torch 42. The plasma torch 42 comprises an elongate tubular cathode, or electron emitter, 48 having an end wall 50. Water coolant is conveyed through the bore 52 of the electron emitter 48 during use of the plasma torch 42. The bore 52 of the electron emitter 48 is aligned with the nozzle 44 formed in a start anode, or electrode 54 surrounding the end wall 50 of the electron emitter 48. The start electrode 54 is mounted in an insulating block 56 surrounding the electron emitter 48. A bore formed in the insulating block 56 provides the third inlet 34 of the abatement device, and conveys a stream of plasma source gas into a cavity 58 located between the end wall 50 of the electron emitter 48 and the start electrode 54.

In operation of the plasma torch 42, a pilot arc is first generated between the electron emitter 48 and the start electrode 54. The arc is generated by a high frequency, high voltage signal typically provided by a generator associated with the power supply for the torch. This signal induces a spark discharge in the plasma source gas flowing in the cavity 58, and this discharge provides a current path. The pilot arc thus formed between the electrode emitter 48 and the start electrode 54 ionises the plasma source gas passing through the nozzle 44 to produce a high momentum plasma flame of ionised source gas from the tip of the nozzle 44. The flame passes from the nozzle towards a secondary anode 60 surrounding the nozzle 44 to define a plasma region 62. The secondary anode 60 may be provided by part of the wall of the chamber 40, or may be a separate member inserted into the chamber 40, in which case the secondary anode 60 may be provided with apertures 64, 66 which align with the inlets 18, 28 of the chamber 40 to enable the ion source and the effluent stream to be conveyed to the plasma region 62. The lower (as illustrated) portion of the secondary anode 60 may be profiled as shown in FIG. 5 to enable the secondary anode to be used instead of the start electrode 54 to generate the plasma stream from the plasma source gas.

In use, the ion source, in this example water, is dissociated by the plasma flame emitted from the nozzle 44 of the torch plasma 42 to form $H^+$ and $OH^-$ ions within the plasma region 62. These ions subsequently react within the chamber 40 with the PFC component(s) of the effluent stream entering the chamber 40. The by-products from the reaction, and any unabated noble gases contained within the effluent stream entering the chamber 40, are exhaust from the chamber 40 through outlet 22, and subsequently conveyed to the liquid ring pump 14.

Some examples of reactions occurring within the chamber 40 will now be described.

Example 1

The reactive fluid is a source of $H^+$ and $OH^-$ ions, for example, water vapour, and the effluent stream contains a perfluorocompound, for example, $CF_4$. The plasma flame dissociates the water vapour into $H^+$ and $OH^-$ ions:

$$H_2O \rightarrow H^+ + OH^- \quad (1)$$

which react with $CF_4$ to form carbon dioxide and HF as by-products:

$$CF_4 + 2OH^- + 2H^+ \rightarrow CO_2 + 4HF \quad (2)$$

A typical gas mixture for performing a dielectric etch in a process tool may contain differing proportions of the gases $CHF_3$, $C_3F_8$, $C_4F_8$ or other perfluorinated or hydrofluorocarbon gas, but the chemical reactions of the $H^+$ and $OH^-$ ions with these components of the waste gas stream will differ in detail but the general form will be as the scheme above.

Example 2

The reactive fluid is again a source of $H^+$ and $OH"$ ions, for example, water vapour, and the waste stream contains $NF_3$. Process tool manufacturers are increasingly adopting $NF_3$ as the chamber cleaning gas of choice for PECVD reactors. Whereas the utilisation of $NF_3$ by the cleaning process is much higher than that of either $CF_4$ or $C_2F_6$, the by-products produced are considerably more reactive and their uncontrolled release is potentially very dangerous. Within the plasma, $NF_3$ dissociates to form $N_2$, $F_2$ and $N_2F_4$:

$$4NF_3 \rightarrow N_2 + 4F_2 + N_2F_4 \quad (3)$$

with the $N_2F_4$ component of the effluent stream subsequently reacting with the $H^+$ and $OH^-$ ions generated from the impingement of the water vapour on the plasma flare:

$$N_2F_4 + 2H^+ + 2OH^- \rightarrow N_2 + 4HF + O_2 \quad (4)$$

Figure 6:
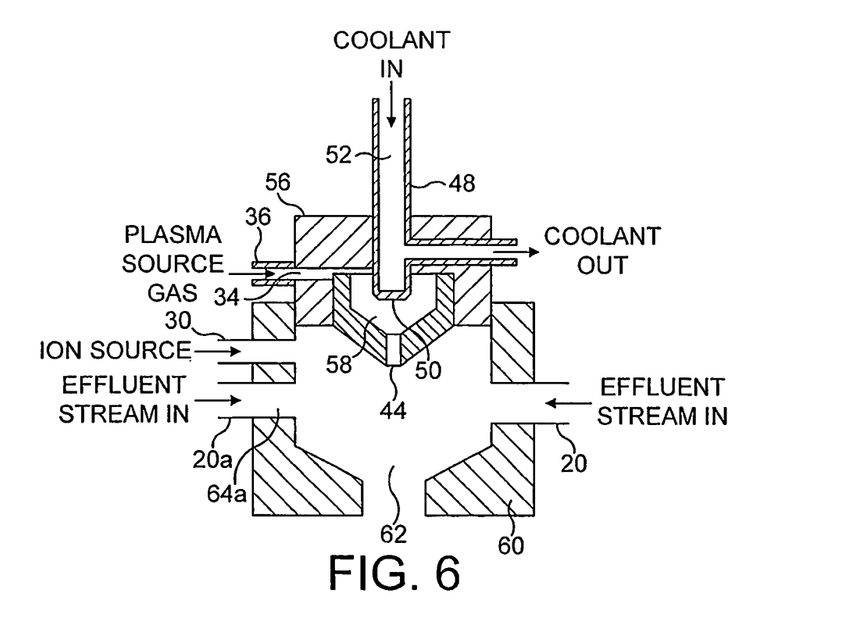
FIG. 6 illustrates the use of the torch of FIG. 5 with a plurality of gas streams entering the abatement device.

As illustrated by the above examples, the same ions may be used to remove various different components from a gas stream. Consequently, the abatement device is suitable to receive a plurality of gas streams, either from similar or different process tools, and convert similar or different components of those gas streams into species that are soluble within the liquid of the liquid ring pump 14. For example, as illustrated in FIG. 6, the abatement device may be provided with an additional inlet for receiving an additional gas stream via conduit 20a, with an additional aperture 64a being provided in the secondary anode 60 to enable the additional gas stream to be conveyed to the plasma region 62.

Figure 7:
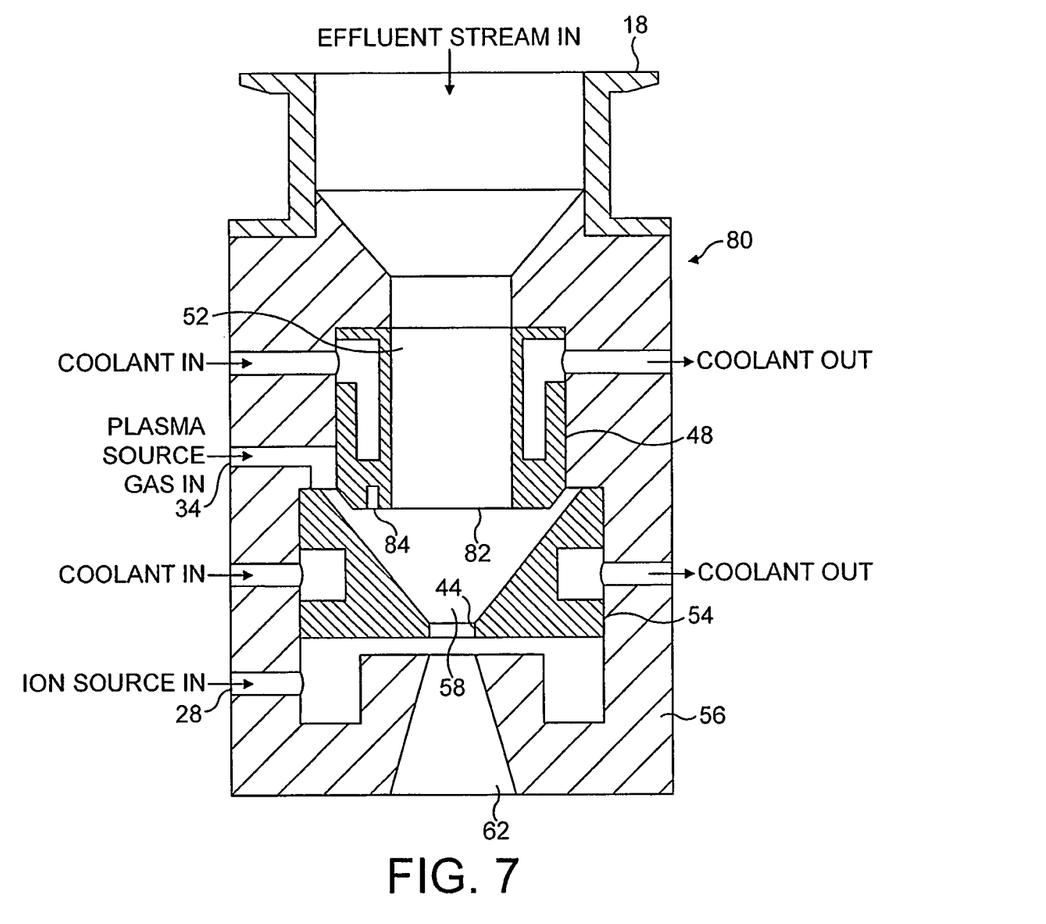
FIG. 7 illustrates of a second embodiment of a plasma torch suitable for use in the device of FIG. 4.

In Example 1 above, the ions react with the $CF_4$ component of the effluent stream entering the chamber 40, and so it is not essential for the effluent stream to pass through the plasma flare to decompose the $CF_4$ prior to reaction with the ions. In contrast, in Example 2 above, it is desirable to convey the effluent stream through the plasma stream in order to dissociate the $NF_3$ into species that are more reactive with the ions generated by the ion source. In the examples illustrated in FIGS. 4 to 6, the effluent stream may be conveyed into the chamber 40 proximate the plasma region 62 so that the PFC passes through the plasma region. FIG. 7 illustrates an example of a plasma torch 80 in which the contact of the effluent stream With the plasma flare is maximised. In this example, the effluent stream is conveyed directly to is the plasma torch 80, rather than into the reaction chamber 40. As shown in FIG. 7, the effluent stream is conveyed from the first inlet 18 of the abatement device into the bore 52 of the electron emitter 48. The effluent stream passes from the open end 82 of the electron emitter 48 into the cavity 58 between the electron emitter 48 and the start electrode 54 of the plasma torch 80. The cavity 58 also receives a stream of plasma source gas entering the abatement device through the third inlet 34 formed in the electrically insulting block 56 surrounding both the electron emitter 48 and the start electrode 54.

In use, similar to the example illustrated in FIG. 5, a pilot arc is first generated between the electron emitter 48 and the start electrode 54 by supplying a high frequency, high voltage signal to a hafnium insert 84. The pilot arc thus formed between the electrode emitter 48 and the start electrode 54 ionises the plasma source gas entering the cavity 58 from the third inlet 34 to produce a high momentum plasma flame of ionised source gas from the tip of the nozzle 44. As the effluent stream enters the cavity 58 from the open end 82 of the electron emitter 48, it mixes with the plasma source gas within the cavity 58 and is emitted from the nozzle 44 with the plasma stream into the plasma region 62. Water is supplied to the plasma region 62 from the second inlet 28, which in this example is also formed in the insulating block 56 of the torch 42. The water is decomposed by the plasma stream to form $H^+$ and $OH^-$ ions, which react with the PFC, and/or with species formed from the dissociation of the PFC by the plasma stream, within the reaction chamber.

Returning to FIG. 2, the liquid ring pump 14 draws the effluent gas from the abatement device 12. Any components of the gas stream which are soluble within the pumping liquid of the liquid ring pump, which is usually water or other aqueous solution, are washed into the pumping liquid as the gas passes through the liquid ring pump 14. Consequently, the liquid ring pump 14 operates as both a wet scrubber and an atmospheric vacuum pumping stage for the effluent gas stream.

Figure 8:
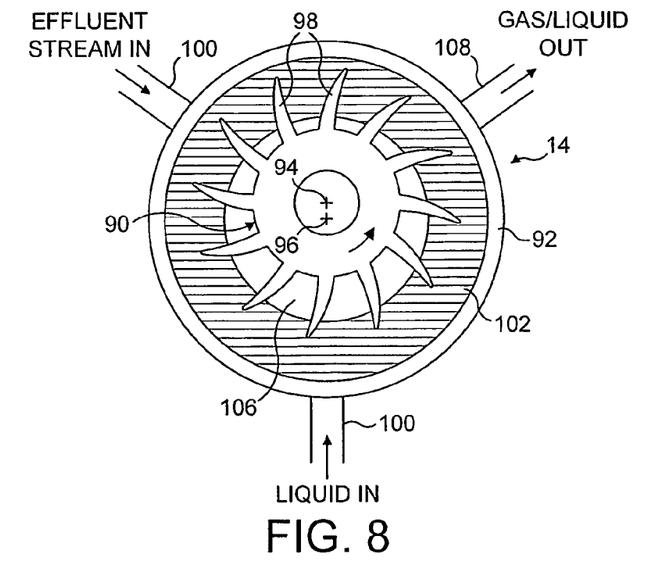
FIG. 8 illustrates schematically an example of a liquid ring pump suitable for use in the apparatus of FIG. 2.

As illustrated in FIG. 8, the liquid ring pump 14 comprises a rotor 90 rotatably mounted in an annular housing 92 such that the rotor axis 94 is eccentric to the central axis 96 of the housing 92. The rotor 90 has blades 98 that extend radially outwardly therefrom and are equally spaced around the rotor 90. With rotation of the rotor 90, the blades 98 engage liquid entering the housing 92 from inlet 100 and form it into an annular ring 102 inside the housing 92. Returning to FIG. 2, the liquid is conveyed to the ling ring pump 14 by a conduit system 15 connected to a suitable source 17 of the liquid, for example a water tank or other reservoir.

The effluent gas stream enters the liquid ring pump 14 through gas inlet 104, and is pulled into the spaces 106 between adjacent blades 98. Any liquid-soluble components of the effluent gas stream, such as HF, become entrained within the annular ring 102 formed within the liquid ring pump 14 by the liquid entering the pump simultaneously with the effluent stream. The liquid ring pump 14 is provided with an exhaust 108 on the outlet side thereof for exhausting from the pump 14 a liquid/gas mixture of a liquid solution comprising the liquid from the annular ring 102 and the liquid-soluble components of the effluent gas stream, and any gaseous species remaining from the effluent gas stream. As liquid is conveyed from the exhaust 108, the annular ring 102 is replenished by supplying fresh liquid to the housing 92 via inlet 100. The liquid/gas mixture stream exhaust from the liquid ring pump 14 may be subsequently separated in a discharge separator (not shown) located downstream from the exhaust 108 of the liquid ring pump 14. The gas may be exhaust to the atmosphere, and the liquid collected for safe disposal. Alternatively, the liquid may be treated for return to the source 17 for re-use.

Figure 9:
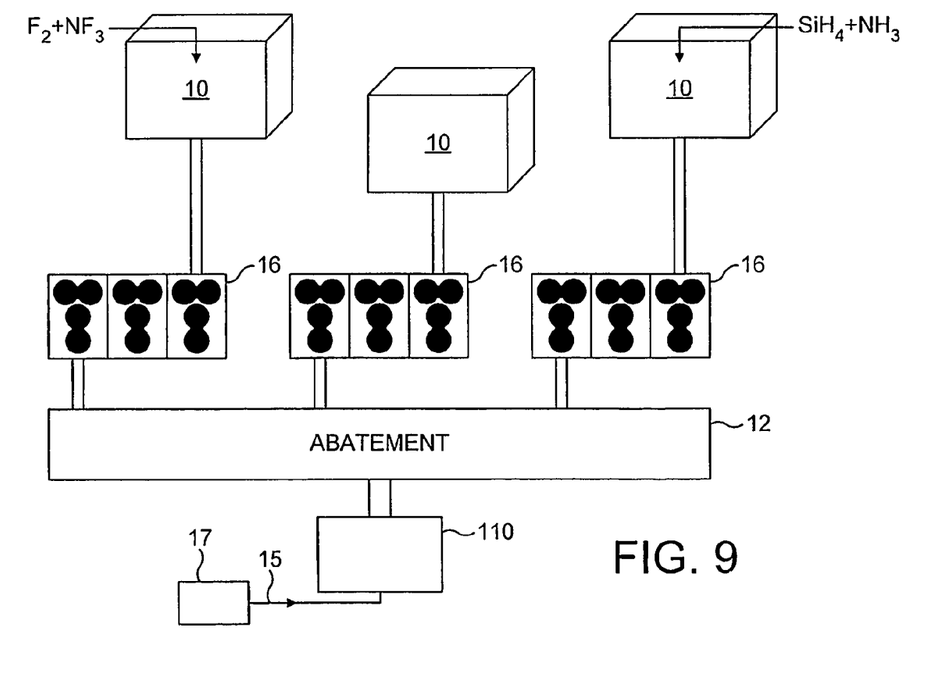
FIG. 9 illustrates a second embodiment of an apparatus for treating an effluent waste stream.

A second embodiment of an apparatus for treating an effluent gas stream exhaust from one or more process chambers 10 of respective process tools is illustrated in FIG. 9. The apparatus of the second embodiment is similar to that of the first embodiment, with the exception that a pump 110 having a screw-type pumping mechanism replaces the liquid ring pump 14 of the first embodiment. This pump 110 is illustrated in more detail in FIG. 10.

Figure 10:
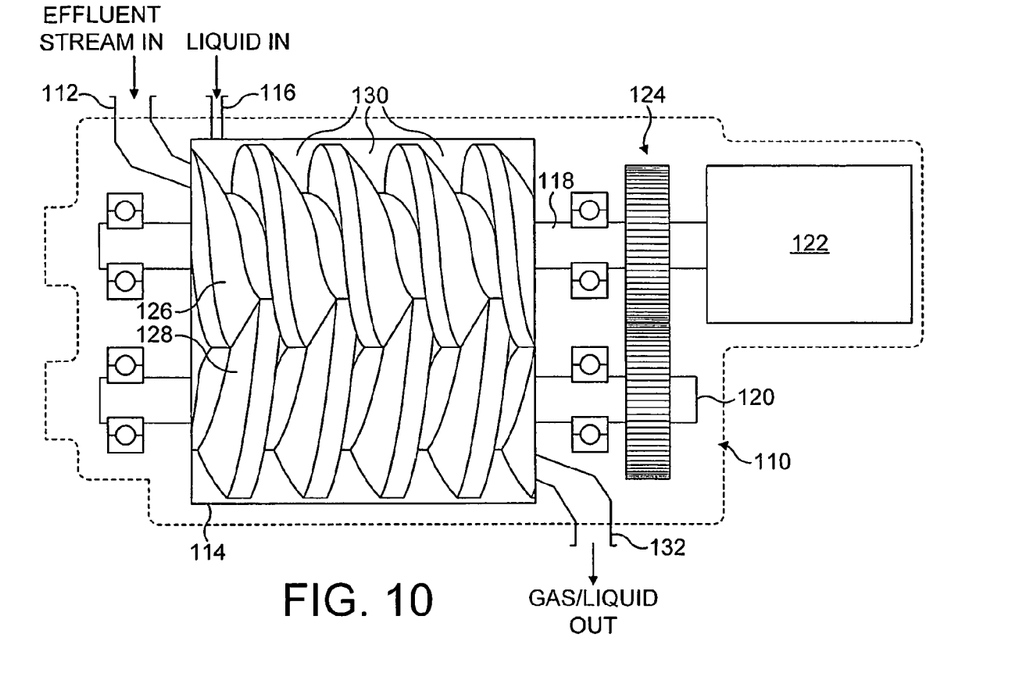
FIG. 10 illustrates schematically an example of a screw vacuum pump suitable for use in the apparatus of FIG. 9.

The first inlet 112 through which the effluent stream enters a housing 114 of the pump 110 is located at an inlet side of the pump. The pump 110 includes a second inlet 116 through which liquid for flushing the pump housing 114 enters the pump housing 114. In this embodiment, the liquid is water, although any other aqueous solution may be used. The pump 110 includes a first shaft 118 and, spaced therefrom and parallel thereto, a second shaft 120. Bearings are provided for supporting the shafts 118, 120. The shafts 118, 120 are adapted for rotation within the housing 114 about the longitudinal axes in a contra-rotational direction. The first shaft 118 is connected to a drive motor 122, the shafts being coupled together by means of timing gears 124 so that in use the shafts 118, 120 rotate at the same speed but in opposite directions. A first rotor 126 is mounted on the first shaft 118 for rotary movement within the chamber 114, and a second rotor 128 is similarly mounted on the second shaft 120. Each of the two rotors 126, 128 are of generally cylindrical shape and has a helical vane or thread respectively formed on the outer surface thereof, the threads intermeshing as illustrated.

In use, the effluent stream enters the pump 110 through the first inlet 112, and the gas is pulled into the cavities 130 between the intermeshing rotors 126, 128. The liquid-soluble components of the effluent stream become entrained within the liquid entering the pump 110 via the second inlet 116. The pump 110 is provided with an exhaust 132 on the outlet side thereof for exhausting from the pump 110 a liquid/gas mixture of a liquid solution comprising the liquid supplied to the pump 110 and the liquid-soluble components of the effluent gas stream, and any gaseous species remaining from the effluent gas stream. As liquid is conveyed from the exhaust 132, the liquid within the pump 110 may be replenished by supplying fresh liquid to the housing 114 via inlet 116. The liquid/gas mixture stream exhaust from the pump 110 may be subsequently separated in a discharge separator (not shown) located downstream from the exhaust 132. The gas may be exhaust to the atmosphere, and the liquid collected for safe disposal. Alternatively, the liquid may be treated for return to the source 17 for re-use.

In the illustrated embodiments, the abatement device 12 is located upstream from the pump 14, 110 so that any liquid-insoluble components of the effluent stream, such as PFCs, can be converted into liquid-soluble components, such as HF, which can be washed into the liquid of the pump 14, 110. Alternatively, the abatement device 12 can be located downstream from the pump 14, 110. In this configuration, the abatement device 12 can operate at atmospheric pressure, although an additional wet scrubber or the like would be required to remove substances such as HF from the gas stream. In either configuration, the absence of any purge gas injection into the evacuation system means that the abatement device 12 serves to abate stream(s) of effluent gas at a flow rate of around 5 slm from each process chamber 10. This requires significantly less power than the abatement of a gas stream containing 70 to 90% purge gas, as in the prior art example shown in FIG. 1.

Figure 11:
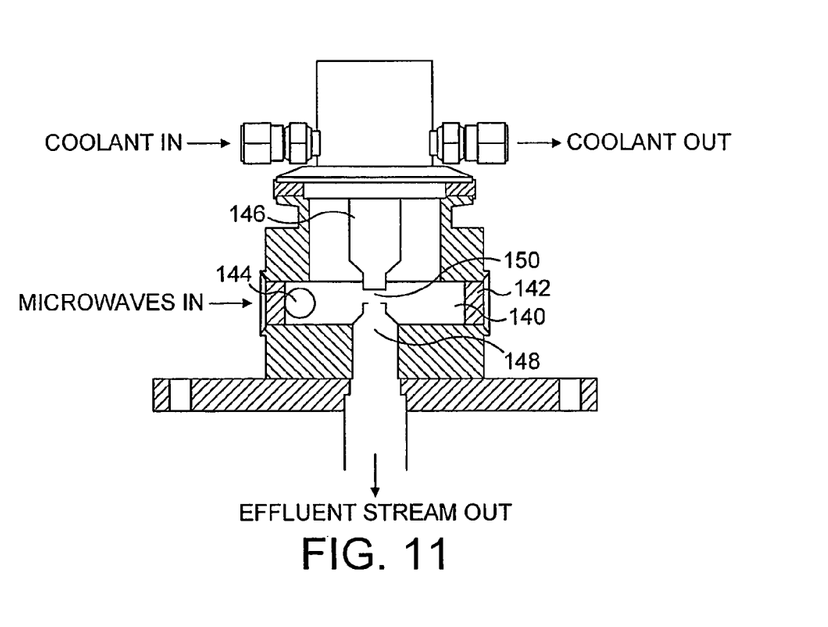
FIG. 11 illustrates another example of a plasma abatement device suitable for use in the apparatus of FIG. 2 or FIG. 9.

As mentioned above, the abatement device 12 may utilise any technique which is suitable for the abatement of a sub-atmospheric effluent stream, such as incineration, plasma abatement, thermal decomposition, decomposition using gas additions. A suitable combustion device is described in our European patent application no. 1,205,707, the contents of which are incorporated herein by reference. An alternative plasma abatement device 12 is illustrated in FIG. 11. The device consists of a microwave resonant cavity 140. Within cavity 140 there is a dielectric insert 142 formed from, for example, PTFE, which is transparent to microwaves. The insert 142 has a circular internal section such that gases entering cavity 140 through the gas inlet 144 do so with a tangential component of velocity. The insert 142 may also act as a seal making the cavity 140 gas tight. Cavity 140 is coupled to a wave-guide (not shown) that is so dimensioned as to transmit microwave energy when connected to a 2.45 GHz microwave generator. Mounted within cavity 140 is a pair of opposed field-enhancing electrodes 146, 148, which serve to confine the plasma generated in cavity 140. The electrode 146 has a channel by means of which cooling water can be passed around the electrode 146. In use, the effluent stream is water saturated prior to entering the abatement device. The water-saturated effluent stream exhaust enters the cavity 140 through the inlet 144 and spirals around electrodes 146,148 before entering the gap 150 between electrodes 146,148, wherein it is energised by the electric field created within the gap 150 by the microwaves entering the cavity 140 through the dielectric insert 142. By energising the effluent stream within the gap 150, a plasma is formed, wherein reaction (2) above occurs for an effluent stream containing $CF_4$. The by-products from the reaction, namely CO2 and HF, leave the cavity 140 through the axial passageway 152 in electrode 148 prior to being received by the pump 14, 110.

While the foregoing description and drawings represent the preferred embodiments of the present invention, it will be apparent to those skilled in the art that various changes and modifications may be made therein without departing from the true spirit and scope of the present invention.

I claim:

1. A system for evacuating a process chamber, the system comprising a vacuum pump for drawing an effluent fluid stream from the chamber and an apparatus for receiving and treating the effluent stream exhaust from the pump, the apparatus comprising an abatement device for converting a component of the effluent stream into a liquid-soluble component at a sub-atmospheric pressure, a pump for at least partially evacuating the abatement device, and means for conveying a liquid to the pump, the pump comprising a pumping mechanism, means for receiving the effluent stream from the abatement device and the liquid from the liquid conveying means, and an outlet for exhausting a solution comprising the liquid and the liquid-soluble component of the gas stream.

2. The system according to claim 1 wherein the vacuum pump is configured to exhaust the effluent stream at a pressure in the range from 10 to 200 mbar.

3. The system according to claim 1 wherein the vacuum pump comprises a multi-stage dry pump.

4. The system according to claim 1 wherein the abatement device is configured to convert a component of the effluent stream into a liquid-soluble component that is less reactive than said component with another component of the effluent stream.

5. The system according to claim 1 wherein the abatement device is configured to convert a component of the effluent stream into a liquid-soluble component that is less reactive than said component with the liquid of the pump.

6. The system according to claim 1 wherein the abatement device comprises means for receiving a reactive fluid for reacting with a component of the effluent stream.

7. The system according to claim 6 wherein the abatement device comprises means for generating an ionised fluid stream to impinge upon the reactive fluid to form reactive species for reacting with the component of the effluent stream.

8. The system according to claim 1 wherein the abatement device comprises a reaction chamber and means for injecting into the reaction chamber an ionised fluid stream containing reactive species for reacting with a component of the effluent stream.

9. The system according to claim 1 wherein the abatement device is configured to convert a liquid-insoluble component of the effluent stream into a liquid-soluble component.

10. The system according to claim 9 wherein the abatement device is configured to convert a perfluorinated or hydrofluorocarbon compound into a substance that is soluble within the liquid of the pump.

11. The system according to claim 10 wherein the compound comprises one of $CF_4$, $C_2F_6$, $CHF_3$, $C_3F_8$, $C_4F_8$, $NF_3$ and $SF_6$.

12. The system according to claim 1 wherein the liquid comprises water.

13. The system according to claim 1 wherein the pump comprises a liquid ring pump.

14. The system according to claim 1 wherein the pumping mechanism comprises intermeshing rotors.

15. The system according to claim 14 wherein the pumping mechanism comprises a screw-type pumping mechanism.

* * * * *

UNITED STATES PATENT AND TRADEMARK OFFICE
CERTIFICATE OF CORRECTION

PATENT NO.        : 8,647,580 B2
APPLICATION NO.   : 11/658240
DATED             : February 11, 2014
INVENTOR(S)       : Smith et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1660 days.

Signed and Sealed this

Twenty-ninth Day of September, 2015

Michelle K. Lee
*Director of the United States Patent and Trademark Office*